United States Patent
Lipka et al.

(10) Patent No.: US 9,702,898 B1
(45) Date of Patent: Jul. 11, 2017

(54) METHOD AND SYSTEM FOR DETECTING AND CORRECTING QUADRATURE ERROR SIGNALS FOR MEMS DEVICE

(71) Applicant: PANASONIC CORPORATION, Osaka (JP)

(72) Inventors: Ronald J. Lipka, Northborough, MA (US); Saroj Rout, Nashua, NH (US); Akhil Garlapati, Lexington, MA (US)

(73) Assignee: PANASONIC CORPORATION, Osaka (JP)

( * ) Notice: Subject to any disclaimer, the term of this patent is extended or adjusted under 35 U.S.C. 154(b) by 301 days.

(21) Appl. No.: 14/321,028

(22) Filed: Jul. 1, 2014

Related U.S. Application Data

(60) Provisional application No. 61/978,264, filed on Apr. 11, 2014.

(51) Int. Cl.
*G01P 21/00* (2006.01)
*B81B 3/00* (2006.01)

(52) U.S. Cl.
CPC ............ *G01P 21/00* (2013.01); *B81B 3/0021* (2013.01); *B81B 2201/0242* (2013.01)

(58) Field of Classification Search
None
See application file for complete search history.

(56) References Cited

U.S. PATENT DOCUMENTS

| | | | | |
|---|---|---|---|---|
| 3,538,774 A | * | 11/1970 | Quick | G01C 19/5635 73/504.14 |
| 8,578,775 B2 | * | 11/2013 | Hayner | G01C 19/5776 329/360 |
| 2013/0031950 A1 | * | 2/2013 | Donadel | G01C 19/5776 73/1.77 |
| 2013/0268228 A1 | * | 10/2013 | Opris | G01C 25/00 702/104 |
| 2014/0250970 A1 | * | 9/2014 | Fang | G01C 25/005 73/1.37 |

* cited by examiner

*Primary Examiner* — Robert R Raevis
(74) *Attorney, Agent, or Firm* — McDermott Will & Emery LLP

(57) ABSTRACT

A quadrature error signal cancellation circuit and technique can detect an undesired quadrature signal component in the output of a MEMS gyroscope and null the quadrature signal component. In one embodiment, the cancellation circuit is configured in a feedback loop with the MEMS gyroscope and includes components to detect and condition the quadrature signal, digitize the conditioned quadrature signal, and generate a quadrature error cancellation signal which is provided back to the MEMS gyroscope.

20 Claims, 2 Drawing Sheets

Figure 1:
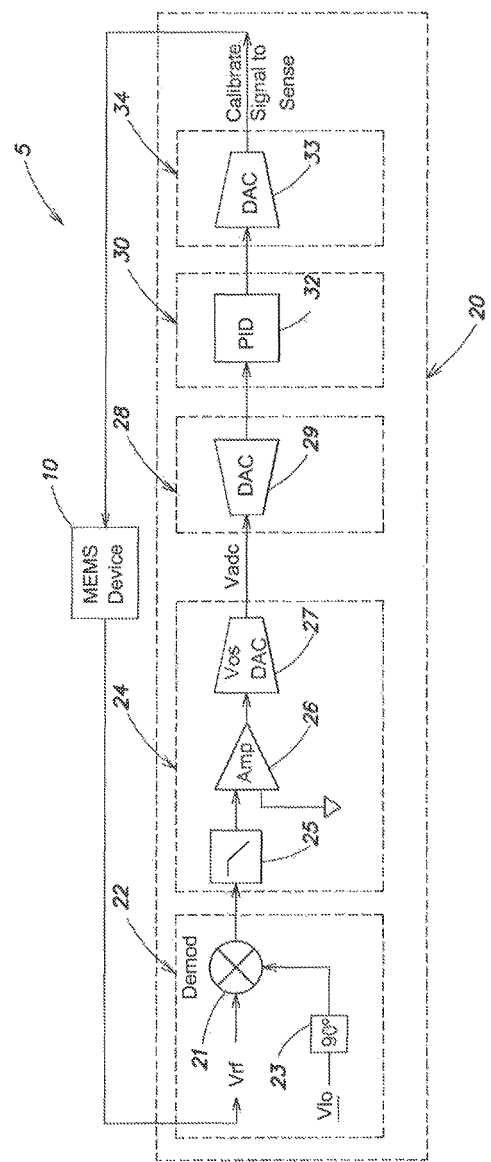

METHOD AND SYSTEM FOR DETECTING AND CORRECTING QUADRATURE ERROR SIGNALS FOR MEMS DEVICE

RELATED APPLICATIONS

This application claims priority to U.S. Provisional Patent Application Ser. No. 61/978,264 filed on Apr. 11, 2014, entitled METHOD AND APPARATUS FOR DETECTING AND CORRECTING QUADRATURE ERROR SIGNALS FROM A MEMS GYROSCOPE, the subject matter of which is incorporated herein by this reference for all purposes.

FIELD OF THE INVENTION

The disclosure relates to Microelectromechanical Systems (MEMS) devices, and, more specifically, to a system and technique for detecting and correcting error signal components in the output signal generated by MEMS devices.

BACKGROUND OF THE INVENTION

An imperfect MEMS gyroscope generates an undesired quadrature signal that is out of phase to the desired "rate" signal that indicates rotation about an axis. Such quadrature signal introduces an error component into the rate signal, leading to less than optimal output results from the MEMS gyroscope. In some instances, quadrature signal characteristics can overwhelm the rate signal generated by the MEMS gyroscope.

Accordingly, a need exists for a system and technique to eliminate the quadrature signal component in the output of a MEMS gyroscope.

A further need exists for a system and technique detect and cancel quadrature signal components generated by a MEMS gyroscope.

SUMMARY OF THE INVENTION

Disclosed herein is a quadrature error signal cancellation circuit and technique that can detect a quadrature error signal component in the output of a MEMS gyroscope and cancel or null the quadrature error signal component. More specifically, the disclosed system and method allows for continuous quadrature error signal cancellation via a feedback loop configuration with the MEMS gyroscope. In one embodiment, a plurality of circuit elements or modules create a signal path that can detect and condition the quadrature error signal, digitize the conditioned signal, convert the digitized signal to a digital domain signal, and, using a digital PID controller, generate a quadrature error cancellation signal capable of nulling the quadrature signal. Using the disclosed system and method, a MEMs gyroscope's quadrature error can be detected and nulled, offering a substantial advantage over gyroscopes that don't contain quadrature nulling capability for those that are calibrated only during manufacturing.

According to one aspect of the disclosure, a method for cancelling a quadrature error signal in an output signal of a microelectromechanical (MEMS) device comprises: A) isolating the quadrature error signal in the output signal of the MEMS device; B) processing the isolated quadrature error signal; C) generating a quadrature error cancellation signal; and D) providing the quadrature error cancelation signal to the MEMS device.

According to another aspect of the disclosure, a system for cancelling the quadrature error signal associated with microelectromechanical (MEMS) apparatus comprises: A) an isolation module receptive to an output signal from MEMS device isolating a quadrature error signal in the output signal of the MEMS device; B) an analog-to-digital converter for converting the isolated quadrature error signal into a sampled quadrature error signal; C) a proportional signal processing module configured for generating a proportional component quadrature error signal by scaling the sampled quadrature error signal with a proportional scaling signal; D) an integral signal processing module configured for generating a integral component quadrature error signal by scaling the sampled quadrature error signal with an integral scaling signal and summing the scaled sampled quadrature error signal with a value of a previously generated integral component quadrature error signal, E) a derivative signal processing module configured for generating a derivative component quadrature error signal by forming a difference value between the sampled quadrature error signal and a value of a previously generated sampled quadrature error signal, and scaling difference value with a derivative scaling signal; F) a first summing element for combining any of the proportional component quadrature error signal, integral component quadrature error signal, derivative component quadrature error signal into a quadrature error cancellation signal; and G) a converter for converting a digital signal representing the quadrature error cancellation signal into an analog signal. In one embodiment, the system further comprises a conditioning module comprising a filter and a voltage source for adding a direct current offset voltage to the isolated quadrature error signal. In another embodiment, the system is combined with a MEMS device configured for receiving the quadrature error cancellation signal and adjusting input parameters of the MEMS device to minimize the amount of quadrature error signal in the output signal of the MEMS device.

DESCRIPTION THE DRAWINGS

Figure 2:
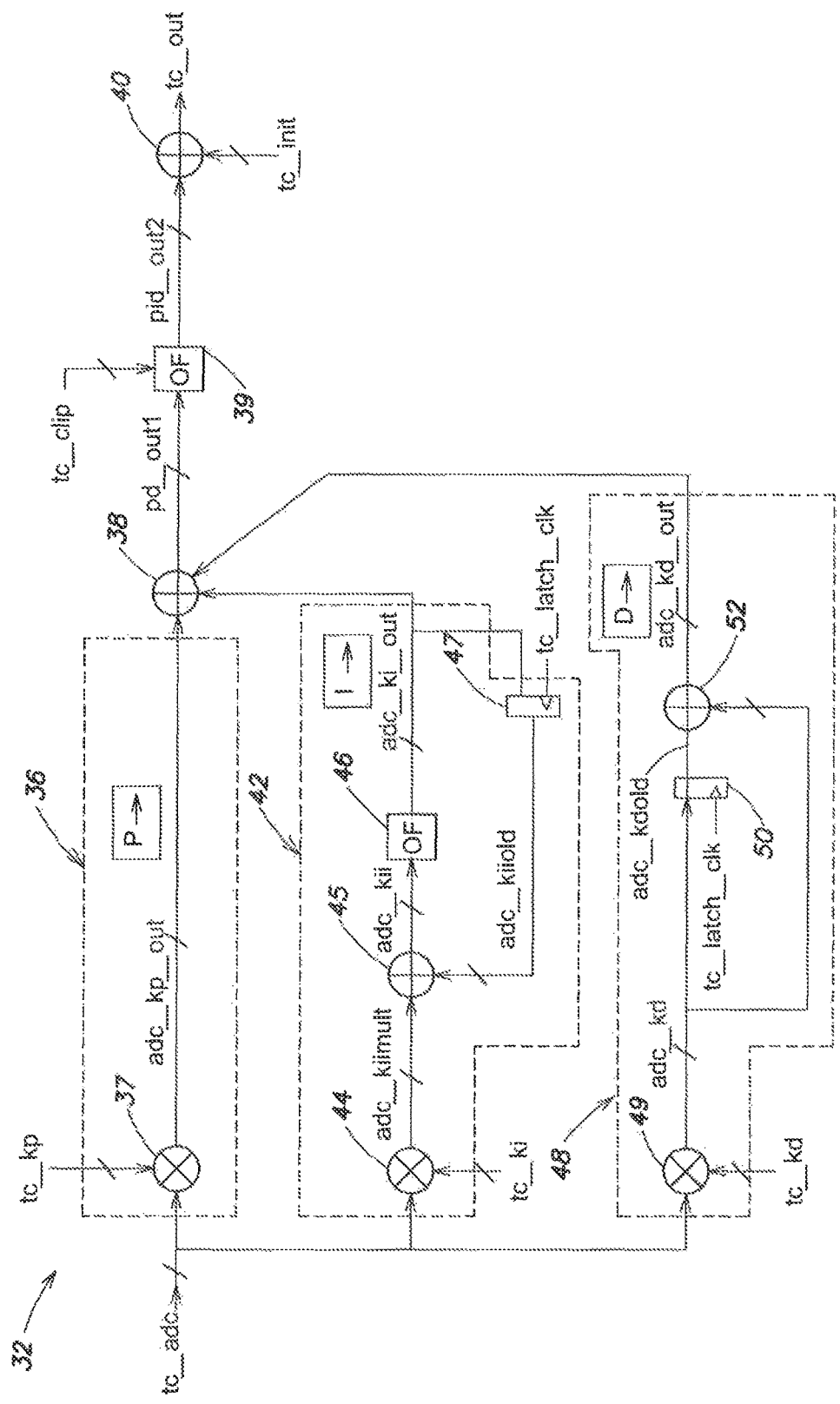

Embodiments of the disclosed subject matter are described in detail below with reference to the following drawings in which:

FIG. 1 illustrates conceptually an exemplary circuit and signal path for quadrature error detection and cancellation in accordance with the disclosure; and FIG. 2 illustrates conceptually a module for generating a quadrature error cancellation signal in accordance with the disclosure.

DETAILED DESCRIPTION

Referring to FIG. 1, a system 5 comprises a quadrature error cancellation circuit 20 and MEMS gyroscope 10 intercoupled into a feedback loop configuration. Quadrature cancellation circuit 20 disclosed herein may be used with any number of commercially available MEMS gyroscopes 10 including those disclosed in as disclosed in United States Patent Application Publication 2012/0227,487, and U.S. Pat. No. 7,023,065. The quadrature error cancellation circuit 20 connects to the MEMS gyroscope 10 to form a closed feedback loop, as illustrated in FIG. 1, thereby enabling continuous quadrature error signal cancellation. The outputs of the MEMS gyroscopes 10 are coupled to the quadrature error cancellation circuit 20, which, in turn, is coupled to the inputs of MEMS gyroscope 10, in accordance with the disclosure contained herein.

In an illustrative embodiment, described in greater detail herein, the quadrature error cancellation circuit 20 comprises and isolation module 22, conditioning module 24, converter module 28, analyzer module 30, and a second converter module 34 coupled in a signal path which provides a feedback loop to MEMS gyroscope 10, as described in greater detail herein.

Quadrature Error Cancellation Circuit

The output signal from MEMS gyroscopes 10 contains both rate and quadrature signal components summed together, such out signal designated as Vrf in FIG. 1. The Vrf signal is coupled to circuit 20 through an isolation component 22 which functions to isolate the quadrature error signal component of the gyroscope output signal from the rate signal component of the MEMS gyroscope output signal. Such isolation is performed by multiplying the received Vrf signal with a signal of the same frequency as the rate signal but phase shifted an amount representing the amount of phase relationship of the quadrature error signal to the rate signal. In the illustrative embodiment, the quadrature error signal is orthogonal, or 90°, out of phase to the rate signal that indicates rotation about an axis.

In an illustrative embodiment, the above functionality is achieved with an isolation component 22 comprising a demodulator 21 and a phase shifter 23. Demodulator 21 may be implemented with any number of existing components, including, but not limited to, an analog multiplier model AD633JRZ-R7, commercially available from Analog Devices, Inc., Norwood, Mass. 02062-9106. Demodulator 21 is adapted to receive the Vrf signal and the output of a phase shifter 23, as illustrated. Phase shifter 23 may be implemented with any number of know designs. In the illustrative embodiment, a local oscillator signal, Vlo signal in FIG. 1, that may be generated to detect the rate signal, is provided to phase shifter 23 where it is phase shifted by a predetermined amount representing the out of phase relationship between the quadrature error signal and the rate signal, e.s. 90° in the illustrative embodiment. It will be obvious to those reasonably skilled in the arts that the amount of phase shift may vary depending on the out of phase relationship of the quadrature error signal to the rate signal inherent in the design of the gyroscope 10.

The phase shifted Vlo signal is then supplied to demodulator 21 where it is multiplied with the received Vrf signal by the demodulator 21, as shown in FIG. 1. Such multiplication operation demodulates the only quadrature error signal while rejecting the rate signal. Depending upon the implementation, demodulator 21, may also produce an undesired high frequency signal, at approximately twice the Vlo frequency, in the isolated quadrature error signal output from demodulator 21.

The isolated quadrature error signal output from demodulator 21 is provided in the illustrative embodiment to a conditioning module 24. Conditioning module 24 comprises a filter 25, amplifier 26 and voltage offset component 27, as illustrated in FIG. 1. In the illustrative embodiment, filter 25 may be implemented with a low-pass filter having a filter frequency cut off set to reject any undesirable high-frequency components introduced into the isolated quadrature error signal received from demodulator 21. Filter 25 may be implemented with any number of existing designs including an R-C filter circuit configuration. Depending on the implementation of the modulator 21, the presence or absence of undesirable frequency components in the isolated quadrature error signal may vary. Accordingly, the necessity for filter 25 and the nature of the filter may likewise vary or, optionally, be eliminated altogether.

The filtered quadrature error signal is a Direct Current (DC) signal and is provided to amplifier 26, which then amplifies the filtered quadrature error signal to provide sufficient gain for the quadrature error cancellation feedback loop of system 5, illustrated in FIG. 1. In one embodiment, amplifier 26 may be implemented to have a programmable gain over a predetermined range, for example from −12 dB up to +25 dB, with a plurality of selectable intermediate gain values therebetween. Alternatively, other amplification amount may be required for compatibility with the parameters of other components within the feedback loop of system 5.

Next, the amplified quadrature error signal output by amplifier 26 is received by offset voltage generator 27 which generates and adds an offset voltage to change the feedback loop set point. In an illustrative embodiment, offset voltage generator 27 may be implemented with a digital to analog converter (DAC) that generates a DC offset voltage by pulling current through a resistor. In one embodiment, the amount of offset voltage may be at the discretion of the system designer.

The offset isolated quadrature error signal is supplied to a conversion module 28 which comprises an analog-to-digital convertor (ADC) 29 and any associated support circuitry. In the illustrative embodiment of circuit 20, analog-to-digital conversion of the isolated and conditioned quadrature error signal facilitates easier back-end processing by analysis module 30. In an illustrative embodiment, analog-to-digital convertor 29 may be implemented with a design which generates an 8-bit successive approximation (SAR) of the analog signal being sampled.

Following digitization by ADC 29, the quadrature error signal is provided to the analysis module 30 which comprises, in a illustrative embodiment, a PID controller 32 which analyzes the digitized quadrature error signal in the digital domain and generates a quadrature error cancellation signal. The PID controller 32 uses the digitized samples of the quadrature error sign to calculate the proportional (P), integral (I), and derivative (D) components of the quadrature error cancellation signal. To that extent, PID controller 32 contains enough onboard memory or has access to memory capable of storing at least one prior digital sample representing a previously sampled quadrature error signal. The P, I, and D signals are scaled by individual weighting factors to affect the feedback loop accuracy, settling time, and stability, or possibly any other parameters as needed based on the exact implementation of the feedback loop within system 5. For additional signal conditioning, a digital offset and/or amplifier block, similar to those described herein, can be added at the input or output of the PID controller 32.

In an illustrative embodiment, PID controller 32 may be implemented as illustrated in the block level schematic diagram of FIG. 2. Referring to FIG. 2, PID controller 32 comprises a proportional process module 36, integral process module 42, derivative process module 48, summing elements 38 and 40, and clipping element 39 in the configurations illustrated in FIG. 2.

The tc_adc signal in FIG. 2 is the digital output of the analog-to-digital converter, i.e. the digitized error signal that indicates the amount of quadrature error. This signal is provided to a multiplier functional element in each of the proportional, integral and derivative modules. The tc_kp, tc_ki, tc_kd signals are multiplier or scaling for signal the proportional, integral, and derivative modules, respectfully within the PID controller 32, as illustrated.

Latches 47 and 50 in the signal path of integrator module 42 and derivative module 48, respectively, store the previous sample(s) of the quadrature error signal following scaling by their respective multiplier element for use in performing the derivative or integral functions. Latches 47 and 50 are clocked by the tc_latch_clk signal.

Signals adc_kp_out, adc_ki_out, and adc_kdout, the outputs of modules 36, 42 and 48, respectively, are summed together to form the pid_out1 signal which can then be clipped to an absolute maximum value that is less than a full allowable value, in the event the MEMS device behaves non-linearly for large quadrature/error signal levels. Clipping elements 39 and 46 (the boxes designated "OF" for overflow) monitor input levels beyond a specified amount and limit their respective outputs thereof to a predetermined maximum specified level.

In the illustrative equations below X[n] represents the present value of a signal X, and X[n−1] represents the previous value of signal X, the previous sample X[n−1] being generated with a delay element, e.g. a flip flop or D latch, or other memory device that is updatable via a PID clock signal.

Proportional process module 36 comprises multiplier element 37 and performs a scaling function, generating an output signal adc_kp_out[n] representing the input signal tc_adc[n] proportionally scaled by signal tc_kp as defined in Equation 1 below:

$$adc\_kp\_out[n]=tc\_kp*tc\_adc[n] \quad \text{(Equation 1)}$$

Integral process module 42 comprises multiplier element 44, summing element 45, clipping element 46 and delay element 47 in the signal path configuration, as illustrated in FIG. 2. Integral process module 42 performs an integrating function and a generates an output signal adc_ki_out[n] representing the product of the input signal tc_adc[n] and scaling signal tc_ki further summed with a prior stored output signal of the integral process as defined in Equation 2 below:

$$adc\_ki\_out[n]=tc\_ki*tc\_adc[n]+adc\_ki\_out[n-1] \quad \text{(Equation 2)}$$

Derivative process module 48 comprises multiplier element 49, delay element 50 and summing element 52 in the signal path configuration, as illustrated in FIG. 2. Derivative process module 48 performs a derivation function and generates an output signal adc_kd_out[n] representing the difference between the current and previous input signal vales tc_adc[n] and tc_adc[n−1] further scaled by signal tc_kd, as defined in Equation 3 below:

$$adc\_kd\_out[n]=tc\_kd*(tc\_adc[n]|tc\_adc[n-1]) \quad \text{(Equation 3)}$$

The output values of process module 36, integral process module 42, and derivative process module 48 are combined by summing elements 38, as defined in Equation 4 below:

$$pid\_out1[n]=adc\_kp\_out[n]+adc\_ki\_out[n]+adc\_kd\_out[n] \quad \text{(Equation 4)}$$

The pid_out1[n] signal may then be clipped, as necessary, by a clipping element 39, prior to being summed with the tc_init signal. The tc_init signal is the initial set point for the entire quadrature error cancellation feedback loop. The system 5 is calibrated with tc_init in nominal, ambient conditions for zero quadrature. When environmental conditions change e.g. supply, temperature, etc. the output of PID controller 32, pid_out2, becomes non-zero so the tc_out signal changes to the sum of tc_init and pid_out2. The tc_out signal represents the output of PID controller 32 and is then supplied to conditioning module 34 and DAC 33.

The digital PID controller 32 described herein offers several important advantages over prior art analog servo loop nulling systems. The PID has programmable clock rate and coefficients that 1) affect the energy level and frequency of undesired tones due to the clock, which appear at the gyroscope rate output; 2) allow for optimization of the systems' transient response to quadrature errors; and 3) allow the quadrature cancellation system to be optimized for variations in gyroscopes, i.e. different quality factors, bandwidths, temperature behavior, etc.

Prior art analog servo loops generate in-band analog noise. An advantage to the implemented digital PID controller 32 is that no noise is added to the system 5 by the quadrature error processing circuit 20, if noise from any of the circuit elements falls below the resolution rate of ADC 29. The only "noise" that may be added is the undesired previously mentioned tone(s) that can then be minimized via programming of the control loop update rate and PID coefficients, tc_kp, tc_ki, tc_kd.

The digital output of PID controller 32, which represents the quadrature error cancellation signal, is then applied to a conversion module 34 which comprises a digital-to-analog convertor (DAC) 33, the output of which is provided back to the MEMS gyroscope 10 to calibrate the MEMS device quadrature signal. DAC 33 converts the low voltage digital output signal of PID controller 32 to high voltage control signals needed to tune the MEMS device for zero quadrature error.

For additional signal conditioning, a digital offset and/or amplifier element, similar to those described herein, can be added at the output of the PID controller 32 as part of conversion module 34. In one embodiment, a high voltage source component capable of generating a high dynamic range may implemented as either as part of, or in addition to, DAC 33 and may comprise one or more cascode cells 150 interconnected between a pull up resistance module, which provides an output voltage to an output terminal Vout, and a low voltage domain current mirror (or current sink), an example of such apparatus being disclosed in commonly owned co-pending U.S. patent application Ser. No. 13/798, 361, filed Mar. 13, 2103, by Ronald J. Lipka et al., and entitled APPARATUS FOR GENERATING HIGH DYNAMIC RANGE, HIGH VOLTAGE SOURCE USING LOW VOLTAGE TRANSISTORS, the subject matter of which is incorporated herein by this reference for all purposes.

The entire feedback loop of system 5 reduces the quadrature signal to zero. Since the quadrature cancellation error signal is digitized, a clock signal can be used to control the update rate and the quadrature cancellation loop can be enabled on an as needed basis if the application uses channel multiplexing or only needs infrequent updates.

It will be obvious to those recently skilled in the art that modifications to the apparatus and process disclosed here in may occur, including substitution of various component values or nodes of connection, without parting from the true spirit and scope of the disclosure. For example, the quadrature cancellation loop may comprise component integrated in all or partially on a semiconductor device, such as a configurable ASICS semiconductor device, or may be formed with discrete components or any combination thereof to realize the system disclosed herein.

What is claimed is:
1. A method comprising:
   isolating a quadrature error signal from an output signal of a microelectromechanical (MEMS) device;
   AD-converting the isolated quadrature error signal into a digitized quadrature error signal by using an analog-to-digital convertor;

generating at least two signals selected from the group consisting of a proportional component quadrature error signal, an integral component quadrature error signal and a derivative component quadrature error signal from the digitized quadrature error signal;

combining the generated at least two signals into a quadrature error cancellation signal;

DA-converting the quadrature error cancellation signal; and providing the DA-converted quadrature error cancelation signal to the MEMS device.

2. The method of claim 1, wherein:
the output signal includes the quadrature error signal and a rate signal, and
the isolating comprises scaling the output signal with a signal having a same frequency of the rate signal but phase shifted by n degrees by which the rate signal is out of phase with the quadrature error signal.

3. The method of claim 2, wherein the n degrees equals 90 degrees.

4. The method of claim 1, further comprising at least one selected from the group consisting of filtering and amplifying the isolated quadrature error signal before the AD-converting.

5. The method of claim 1, further comprising adding a voltage offset signal to the isolated quadrature error signal before the AD-converting.

6. The method of claim 1, wherein the generating comprises generating the proportional component quadrature error signal by scaling the digitized quadrature error signal with a proportional scaling signal.

7. The method of claim 1, wherein:
the generating comprises generating the integral component quadrature error signal by scaling the digitized quadrature error signal with an integral scaling signal, and
the generating further comprises summing the scaled digitized quadrature error signal with a value of a previously generated integral component quadrature error signal.

8. The method of claim 1, wherein:
the generating comprises generating the derivative component quadrature error signal by forming a difference value between the digitized quadrature error signal and a value of a previously generated digitized quadrature error signal, and
the generating further comprises scaling the difference value with a derivative scaling signal.

9. The method of claim 1, wherein:
the generating includes generating the proportional component quadrature error signal, the integral component quadrature error signal and the derivative component quadrature error signal from the digitized quadrature error signal, and
the combining includes combining the generated proportional component quadrature error signal, integral component quadrature error signal and derivative component quadrature error signal into the quadrature error cancellation signal.

10. The method of claim 1, wherein the analog-to-digital convertor is implemented with a design which generates an 8-bit successive approximation.

11. A system comprising:
a microelectromechanical (MEMS) device; and
a quadrature error canceling circuit connected to the MEMS device, configured to receive an output signal from the MEMS device, convert the output signal into an quadrature error cancellation signal and input the quadrature error cancellation signal to the MEMS device, wherein the quadrature error canceling circuit comprises:
an isolation module configured to receive the output signal and isolate a quadrature error signal of the output signal of the MEMS device;
an analog-to-digital converter configured to convert the isolated quadrature error signal into a digitized quadrature error signal;
an PID module configured to receive the digitized quadrature error signal, generate at least two signals selected from the group consisting of a proportional component quadrature error signal, an integral component quadrature error signal and a derivative component quadrature error signal from the digitized quadrature error signal, combining the generated at least two signals into a quadrature error cancellation signal; and
a digital-to-analog converter configured to convert the quadrature error cancellation signal into an analog signal and inputting the analog signal to the MEMS device.

12. The system of claim 11, further comprising:
a proportion signal processing module configured to generate the proportional component quadrature error signal by scaling the digitized quadrature error signal with a proportional scaling signal;
an integral signal processing module configured to generate the integral component quadrature error signal by scaling the digitized quadrature error signal with an integral scaling signal and sum the scaled digitized quadrature error signal with a value of a previously generated integral component quadrature error signal;
a derivative signal processing module configured to generate the derivative component quadrature error signal by forming a difference value between the digitized quadrature error signal and a value of a previously generated digitized quadrature error signal, and scaling difference value with a derivative scaling signal; and
a combining element configured to combine any two of the proportional component quadrature error signal, the integral component quadrature error signal and the derivative component quadrature error signal into a quadrature error cancellation signal.

13. The system of claim 11, further comprising:
a conditioning module disposed between the isolation module and the analog-to-digital converter, and configured to add a direct current offset voltage to the isolated quadrature error signal.

14. The system of claim 11, wherein the PID module is configured to generate the proportional component quadrature error signal, the integral component quadrature error signal and the derivative component quadrature error signal from the digitized quadrature error signal, and configured to combine the generated proportional component quadrature error signal, integral component quadrature error signal and derivative component quadrature error signal into the quadrature error cancellation signal.

15. The system of claim 11, wherein the analog-to-digital convertor is implemented with a design which generates an 8-bit successive approximation.

16. The system of claim 11, wherein:
the isolation module includes:
a demodulator configured to demodulate the quadrature error signal, and a phase shifter configured to shift a phase of a local oscillator signal by n degrees.

17. The system of claim 16, wherein the n degrees equals 90 degrees.

18. The system of claim 11, further comprising:
a conditioning module disposed between the isolation module and the analog-to-digital converter, and configured to filter the isolated quadrature error signal.

19. The system of claim 11, further comprising:
a conditioning module disposed between the isolation module and the analog-to-digital converter, and configured to amplify the isolated quadrature error signal.

20. The system of claim 11, wherein the PID module generates the proportional component quadrature error signal by scaling the digitized quadrature error signal with a proportional scaling signal.

\* \* \* \* \*